United States Patent [19]

Kadekodi et al.

[11] Patent Number: 4,528,594
[45] Date of Patent: Jul. 9, 1985

[54] HIGH RESOLUTION QUADRILINEAR CCD IMAGER

[75] Inventors: Narayan K. Kadekodi, Torrance; Larry S. Shey-Ping, San Pedro; Abd-El-Fattah A. Ibrahim, Palos Verdes Estates, all of Calif.

[73] Assignee: Xerox Corporation, Stamford, Conn.

[21] Appl. No.: 486,766

[22] Filed: Apr. 20, 1983

[51] Int. Cl.³ .............................................. H04N 5/30
[52] U.S. Cl. .................................... 358/213; 357/24; 358/293
[58] Field of Search .............................. 358/293, 213; 357/24 LR

[56] References Cited

U.S. PATENT DOCUMENTS

| | | | |
|---|---|---|---|
| 3,911,467 | 10/1975 | Levine | 357/24 LR |
| 3,971,003 | 7/1976 | Kosonocky | 357/24 LR |
| 4,081,841 | 3/1978 | Ochi | 357/24 LR |
| 4,291,239 | 9/1981 | Weimer | 357/24 LR |
| 4,348,690 | 9/1982 | Jastrzebski | 357/24 LR |
| 4,473,836 | 9/1984 | Chamberlain | 357/24 LR |

FOREIGN PATENT DOCUMENTS

| | | | |
|---|---|---|---|
| 2813254 | 4/1979 | Fed. Rep. of Germany | 357/24 LR |
| 57-68070 | 4/1982 | Japan | 357/24 |

Primary Examiner—Gene Z. Rubinson
Assistant Examiner—L. C. Schroeder
Attorney, Agent, or Firm—Franklyn C. Weiss

[57] ABSTRACT

A barrier gate isolated channel charge coupled device integrated circuit imager which permits the barrier gate to define the transfer channel from an inner shift register to an outer shift register to the exclusion of the field oxide layer. By extending the length of the barrier gate slightly and bringing the storage gate down and out around each barrier gate, and widening the field oxide dimension, relative to one another, the buried channel potential voltage remains high allowing for more efficient charge transfer or, if desired, the isolated channel dimension can be decreased while still maintaining a high minimum buried channel potential voltage.

1 Claim, 5 Drawing Figures

HIGH RESOLUTION QUADRILINEAR CCD IMAGER

This invention relates to a high resolution quadrilinear CCD imager with a single multiplexed video output which achieves high resolution imaging while using moderate design rules wherein efficient parallel charge transfer is effected by employing a novel structure that eliminates the narrow channel effect.

BACKGROUND OF THE INVENTION

Conventional charge-coupled device (CCD) line imagers use two readout shift registers. The maximum pixel density of this bilinear design is limited by the minimum polysilicon overlap and spacing design rules in the shift registers. Pixel density can be increased by employing a quadrilinear shift register organization to relieve these design rule constraints. See, for example application Ser. No. 285,250, which is assigned to the same assignee as the present invention. Further, reference is made to an article by H. Herbst and H. J. Peleiderer, "Modulation Transfer Function of Quadrilinear CCD Imager", Electronics Letters, Volume 12, Number 25, pps. 676 and 677, 1976. However, as the imager resolution and pixel density increase even further, a new limitation arises due to the narrowing of the CCD parallel transfer channels. That is, the channel between the inner shift register and the outer shift register, in such a quadrilinear register array, becomes narrower due to the increased density of circuitry on a fixed length integrated circuit chip. This narrowing of the charge transfer path from the inner to the outer shift register decreases the minimum potential of the channel which therefore affects the charge transfer efficiency from the inner to the outer shift register. In order to accomplish higher density charge coupled device imagers, this potential barrier problem must be overcome.

According to the present invention, a high resolution element quadrilinear CCD imager array is utilized with a novel structure to eliminate the narrow channel effect which decreases the parallel charge transfer efficiency. In such a charge coupled device imager, the barrier gate material is utilized to define the channel rather than the field oxide as set forth in the prior art. In addition, the storage gate is made wider and overlaps the field oxide as a further element in defining the principles of the present invention.

DESCRIPTION OF THE DRAWINGS

For a more complete understanding of the invention, reference may be had to the following detailed description of the invention in conjunction with the drawings wherein.

DETAILED DESCRIPTION OF THE INVENTION

Figure 1:
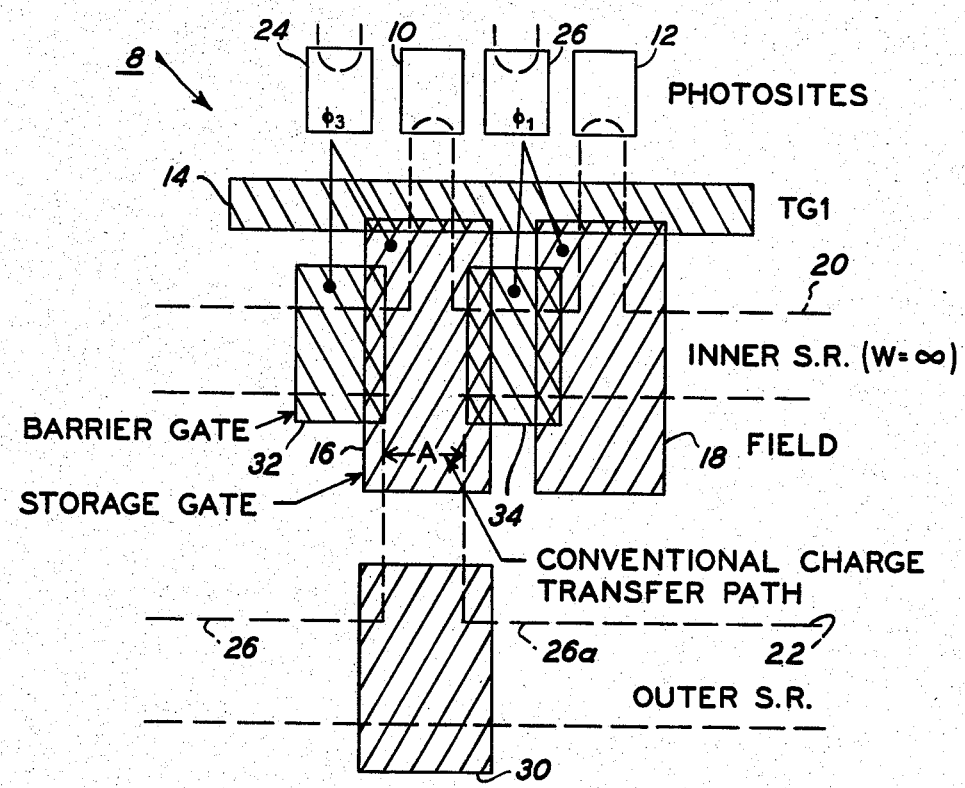
FIG. 1 is a top view of an integrated circuit charge coupled device showing two photosites and associated circuitry.

FIG. 1 of the present application shows a conventional prior art quadrilinear charge coupled device imager. This imager could have many photosite areas from a few ranging all the way up to many thousands of photosites on a single silicon integrated circuit chip. For ease in description of the present application, only two of the many photosite areas will be described, but it will be understood that the principles of the present invention are applicable from a few to said many thousands of photosite areas. The CCD imager 8 in FIG. 1 discloses four of the many photosite areas 10, and 12, 36 and 38. Two photosites 10 and 12 will have the charge detected therein transferred to inner and outer shift registers below the photosite array while photosites 36 and 38 will have their charge transferred to inner and outer shift registers above the photosite array but not shown in FIG. 1 for the purpose of clarity. Thus photosite areas 10 and 12 have the charge deposited therein transferred via a transfer gate 14 to storage gates 16 and 18 in the inner shift register 20. However, the quadrilinear design mandates that every other one of the photosite charge be transferred to an outer shift register in a parallel transfer mode wherein both inner and outer shift registers 20 and 22, are shifted out in serial. Thus, the charge from photosite 10 which is now stored at storage gate 16 must be transferred to a storage area 30 in the outer shift register 22 via a parallel charge transfer channel 28 which is defined by the field layer 26 and 26a. However, the width of the storage gate 16 in the inner shift register 20 is larger than the width of parallel charge transfer path 28.

A first barrier to maintain the charge in the storage gate 16 from flowing back into the photosite area 10 is the first transfer gate 14. In order to isolate the charge in storage area 16 from one to the left of it, not shown, and the one to the right of it, 18, barrier gates 32 and 34 are deposited on the integrated circuit chip at the same time that the first transfer gate 14 is deposited. That is, transfer gate 14 and barrier gates 32 and 34 are deposited on the integrated circuit chip overlapping the storage gate which has been deposited over the field layer of the charge coupled device imager. Now, depending upon how the phase clocks 01 and 03 are applied to the areas of the imager, the various charges will be moved around as set forth above.

Figure 2:
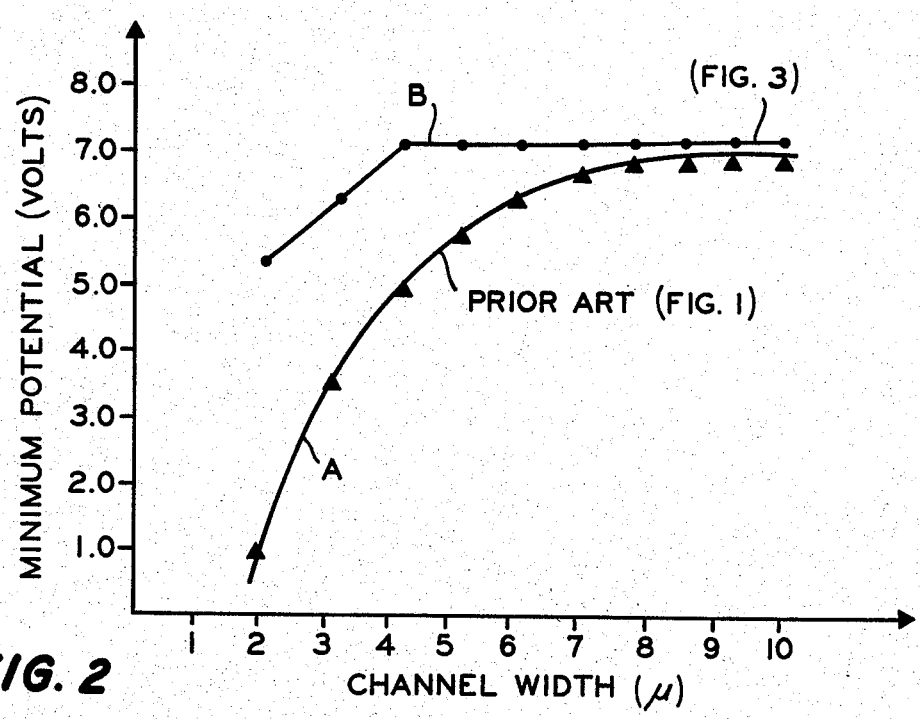
FIG. 2 is a representative diagram of the channel width versus the minimum potential of the buried channel between the inner and outer shift registers in accordance with the principles of the present invention.

Area 28 in FIG. 1 is the width of the channel which defines the charge transfer path from the storage gate 16 in the inner shift register 20 to the storage gate 30 in the outer shift register 22. This is the channel width as seen in the lower curve A in FIG. 2. As conventional integrated circuit charge coupled devices are measured, when the channel width 28 in FIG. 1 is approximately 10 microns wide, the minimum buried channel potential is approximately 7 volts. As the channel width is manufactured with ever increasingly smaller dimensions, the minimum buried channel potential decreases to approximately 1 volt when the channel width is 2 microns wide. Thus, in order to effect any sort of transfer efficiency, it can be seen from FIG. 2 that the minimum channel width cannot be much less than 10 microns wide and still maintain a minimum level of parallel charge transfer efficiency.

Figure 3A:
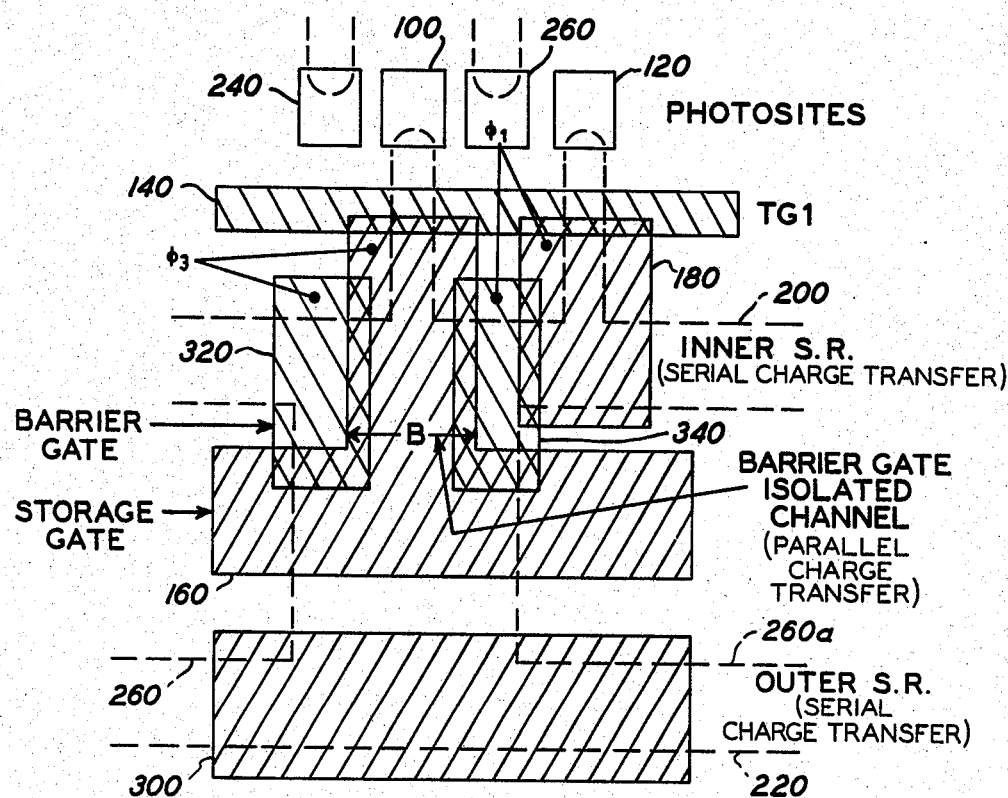
FIGS. 3A and 3B is a top view of a charge coupled device integrated circuit imager showing two photosites out of many utilizing the principles of the present invention, and associated potential diagram, respectively.
Figure 3B:
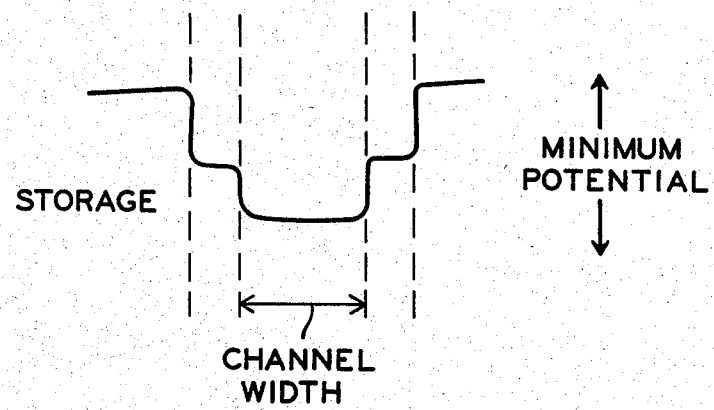

Referring now to FIGS. 3a and 3b, the quadrilinear charge coupled device imager is described in accordance with the principles of the present invention. As with the conventional quadrilinear imager in FIG. 1, photosites 100 and 120 will have their charge transferred to inner and outer shift registers below the photosite array while photosites 360 and 380 will have the charge detected therein transferred to inner and outer shift registers above the photosite array but not shown in FIG. 3 for purposes of clarity. Thus, the charges detected by photosites 100 and 120 will be transferred by transfer gate 140 to storage gate 160 and 180. Storage gate 180 is similar to but not exact with the storage gate 18 as seen in FIG. 1. It is remembered that the charge from photosite 120 only needs to be transferred to storage gate 180 because it is this signal that will be transferred out in a serial manner through the inner shift register to multiplexing circuitry somewhere else on the chip and as described hereinafter. However, the major changes are made to the other photosite in the pair wherein charge from photosite 100 is transferred via transfer gate 140 to the enlarged storage gate 160. As seen in FIG. 3a, the storage gate 160 is pulled down further toward the outer shift register and is also widened, much wider than the storage gate in FIG. 1 and wider even than the channels through which the charge is to be transferred. The barrier gates 320 and 340 operate in a similar manner and are slightly more elongated than those in FIG. 1, and are also utilized to define the parallel charge transfer path 280. As seen in FIG. 3a, the barrier gate 320 now defines the channel 280 rather than the field oxide 26 in FIG. 1. That is, as can be seen in FIG. 3, the field oxide 260 has been moved away considerably and no longer defines the charge transfer path of the charge from photosite 100 stored in the inner shift register 200 to be transferred to storage area 300 on the outer shift register 220.

FIG. 3b shows a representative depiction of the potential levels within the CCD channel 280 between the inner shift register 200 and the outer shift register 220. As can be seen, the field oxide 260 and 260a define the outer limits of the channel 280 while the barrier gates 320 and 340 define the actual transfer and storage boundaries. Thus, for the same channel width, the buried channel potential remains high allowing more efficient charge transfer which reduces the charge trapping effect. This can be seen in reference again to FIG. 2, but now to curve B. As representative CCD imagers were tested, the minimum buried channel potential is seen to remain almost constant at 7 volts as the channel width 280 of FIG. 3a was decreased from 10 to approximately 4 microns wide. Only when the channel width is made slightly smaller than 4 microns did the minimum buried channel potential begin to decrease. At least two factors may be deduced from this situation. First, for the same channel width as set forth in FIG. 3 as compared to the conventional imager in FIG. 1, the buried channel potential remains high allowing more efficient charge transfer. Secondly, if desired, the dimensions can be made smaller, that is, narrower, and still maintain a very high minimum buried channel potential to effect high efficiency in charge transfer from the inner shift register to the outer shift register. The three major changes to the conventional CCD imager in FIG. 1 to effect the new quadrilinear CCD imager in FIG. 3 are: 1, pulling the barrier gate further down toward the outer shift register; 2, bringing the storage register down even further toward the outer shift register, and; 3, widening it approximately in the middle between the inner shift register and the outer shift register, in a T-shape and also widening the field layer dimensions to allow the barrier gate to define the channel width the exclusion of the field layer.

Figure 4:
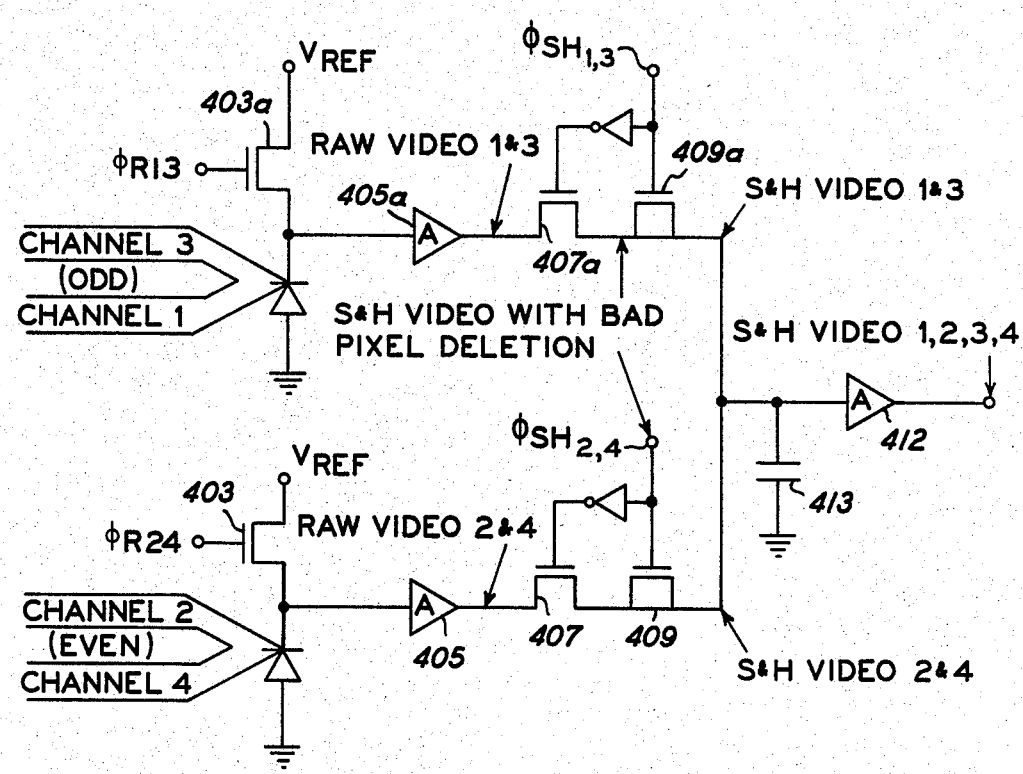
FIG. 4 is a schematic representation of circuitry on the integrated circuit chip with the CCD imager which accomplishes four channel to one channel output multiplexing with bad pixel deletion.

Once the signals are stored in shift registers 20, 22 in FIG. 1 or 200, 220 in FIG. 3, or the inner and outer shift registers on the other side of each photosite array, not shown, the signals are shifted out to the right in serial readout and must be multiplexed together to form a single video pulse train which can be used by subsequent circuitry. Prior art CCD imagers transfer the four channels of video information off the chip to subsequent circuitry in order to effect the multiplexing of four discrete channels to one multiplexed channel comprising the entire detected line of information. In FIG. 4 is shown the circuitry which would be deposited directly on the same silicon chip as the CCD imager as set forth FIGS. 1 and 3 and it can be utilized to not only multiplex the four channels of information to one complete channel, but also to delete bad pixels which may be inherent in the manufactured CCD array. That is, due to the high cost of manufacture of 1.2" (3 cm.) silicon CCD imagers, wherein there are possibly 3533 elements or photosites in one line, utilizing 8 micron by 6 micron photosites, the smaller number of photosite manufacturing errors can be tolerated and still utilize the full CCD imager array. Thus, at the time of manufacture, the CCD imager would be tested and the bad pixels in the entire array would be noted. Then when it became time to install the imager in an operating device utilizing it in a scanning mode, the circuitry will eliminate any outputs from these bad pixels and by utilizing "sample and hold" techniques, the pixel brightness information from an adjacent photosite can be inserted into the pulse train at the spot of the bad pixel. If, for example, one good photosite detected a distinct level of light information deflected toward it, while the next, or adjacent, photosite has been originally detected as bad, the output pulse train can be made to insert into the bad pixel place in the data stream the same data information as existing in the immediately previous, or, adjacent photosite area, assuming that with such a high resolution image, the brightness level in adjacent photosite areas does not decrease the accuracy of the scanned information to any perceptible degree.

Seen in FIG. 4, therefore, are channels 2 and 4 as from inner and outer registers 20 and 22 from FIG. 1 or 200 and 220 from FIG. 3. The other shift register arrays above photosites in FIGS. 1 and 3, not shown, but can be depicted for purposes of FIG. 4 as channel 3 and channel 1. Thus, the even bits from the pulse train would be depicted as channel 2 and channel 4 while the odd bits are depicted as channel 1 and channel 3 in the upper half of FIG. 4. As channels 2 and 4, for example, are clocked out to the multiplexing circuit, one step in the multiplexing process is already being accomplished because of the actual position of the bits in the position of the inner and outer shift registers. That is, as the information is transferred in a vertical direction in FIG. 1 or FIG. 3 to the inner and outer shift registers, the position of each of the photosite detected information is fixed as directly below each of the photosite areas so that when the inner and outer shift registers are pulsed in a serial readout manner, each photosite information charge packet will be transferred in place and reach the point in the chip multiplexing circuitry in FIG. 4 in the necessary arrangement. However, the same procedure is being followed for channels 1 and 3 on the upper half of FIG. 4. Thus, the circuitry shown therein must now pulse each individual circuit in order to place in the output pulse train the distinct analog signal information packets representative of channels 1, 2, 3, and 4 in the correct order. A reset clock would be first applied to transistors 403 and 403a in order to allow the reference voltage to be applied to the diffusion nodes 401 and 401a. Next, taking channels 2 and 4 as representative for channels 1 and 3, channel 2 and channel 4 signal charge would be deposited on the floating diffusion node 401. The resultant change of node voltage will be detected by the source follower amplifier 405 and 405a. These source follower amplifiers 405 and 405a act as buffers and contain the raw video pulse trains 1, 3 and 2, 4. The raw video is then sampled by transistors 407 and 407a which are enabled by non-overlapping phase clocks which selectively enable each transistor or disable each transistor, thus allowing the signals from channels 1 to 4 to pass accordingly. If a bad pixel was detected, then the non-overlapping clock signal applied to either transistors 407 or 407a or will maintain the signal on longer such that the signal preceding the bad pixel is chosen as the pixel level to be impressed into the video stream for the signal level of the bad pixel detected at time of manufacture. This sample and hold circuit allows the signal detected to be maintained at the level for many clock periods, if necessary, usually only one, however. The output from transistor 407 would be the sample and hold video trains 1 and 3 multiplexed together while the output from transistor 407a would be the sample and hold video 2 and 4 already multiplexed together. The capacitor networks 409 and 409a, together with capacitor 413, operate as a pulse filter to provide effective sample and hold charge cancellation and ensure a flat video level. The output from amplifier 412 is the sample and hold video pulse trains 1, 2, 3, and 4 with one train indicative of the line of information detected by the row of photosites on the imager in FIG. 1 or FIG. 3.

While the invention has been described with reference to specific embodiments, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A high resolution charge coupled device (CCD) imager deposited on a single integrated circuit chip comprising:

photosite means for detecting the amount of light impinged thereon, transfer gate means adjacent said photosite means for transferring the electronic charges under said photosite means indicative of said amount of light impinged thereon, inner shift register means for receiving said electronic charges from said photosite means, outer shift register means for receiving every other one of said charges from said inner shift register means, said outer shift register means receiving said charges via isolated channel means which comprises at least two barrier gate means deposited on said inner shift register means and lying adjacent a path from said transfer gate means through said inner shift register means to said outer shift register means, the separation of said barrier gate means defining the channel width of movement for said electronic charges, generally T-shaped storage gate means deposited on said imager between said barrier gate means and said integrated circuit chip to receive said electronic charges from said transfer gate means, the generallly vertical part of said T-shape lying on and slightly wider than said channel width and the horizontal part of said T-shape lying horizontal or parallel to and generally between said inner and outer shift register means, and field oxide layer means as the first layer between the integrated circuit chip and said storage gate means defining the inner and outer shift register means with a separation at said channel wider than the channel defined by said barrier gate means but not as wide as the horizontal part of said T-shaped portion of said storage gate.

* * * * *

UNITED STATES PATENT AND TRADEMARK OFFICE
CERTIFICATE OF CORRECTION

PATENT NO. : 4,528,594
DATED : July 9, 1985
INVENTOR(S) : Narayan K. Kadekodi, Shey-Ping Larry Sheu, Abd-El-Fattah A. Ibrahim It is certified that error appears in the above—identified patent and that said Letters Patent are hereby corrected as shown below:

On the title page;
Correct the spelling of Larry S. Shey-Ping to --Shey-Ping Larry Sheu--.

Signed and Sealed this

Eighth Day of October 1985

[SEAL]

Attest:

DONALD J. QUIGG

Attesting Officer

Commissioner of Patents and
Trademarks—Designate